US008541816B2

(12) United States Patent
Hashimoto et al.

(10) Patent No.: US 8,541,816 B2
(45) Date of Patent: Sep. 24, 2013

(54) III NITRIDE ELECTRONIC DEVICE AND III NITRIDE SEMICONDUCTOR EPITAXIAL SUBSTRATE

(75) Inventors: Shin Hashimoto, Itami (JP); Tatsuya Tanabe, Itami (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 208 days.

(21) Appl. No.: 12/740,770

(22) PCT Filed: Oct. 28, 2008

(86) PCT No.: PCT/JP2008/069564
§ 371 (c)(1),
(2), (4) Date: Apr. 30, 2010

(87) PCT Pub. No.: WO2009/057601
PCT Pub. Date: May 7, 2009

(65) Prior Publication Data
US 2010/0230687 A1 Sep. 16, 2010

(30) Foreign Application Priority Data
Nov. 2, 2007 (JP) .................................. 2007-286534

(51) Int. Cl.
*H01L 21/338* (2006.01)
(52) U.S. Cl.
USPC .......................................... 257/194; 257/192
(58) Field of Classification Search
USPC ............................ 257/E29.247–252, 192–196
See application file for complete search history.

(56) References Cited

U.S. PATENT DOCUMENTS

| 2002/0100412 A1 | 8/2002 | Hirayama et al. |
| 2004/0144991 A1 | 7/2004 | Kikkawa |
| 2006/0054925 A1 | 3/2006 | Kikkawa |
| 2006/0108606 A1* | 5/2006 | Saxler et al. ................ 257/200 |

FOREIGN PATENT DOCUMENTS
EP   1 746 641 A1   1/2007

(Continued)

OTHER PUBLICATIONS

Tsuchiya et al., "Current Collapse Analysis for AlGaN/GaN HFETs by Using the Plane KFM Method," Project for the "Development of Low Power Consumption High Frequency Devices by Using Nitride Semiconductors," Collection of draft reports for the Final Results Report Meeting, May 24, 2007, p. 84-85.
Sabuktagin et al., "Surface Charging and Current Collapse in an AlGaN/GaN Heterostructure Field Effect Transistor," Applied Physics Letters, Feb. 18, 2005, p. 083506-083506-3, vol. 86.

(Continued)

*Primary Examiner* — Cuong Q Nguyen
(74) *Attorney, Agent, or Firm* — Venable LLP; Michael A. Satori; Tamatane J. Aga

(57) ABSTRACT

In a group III nitride hetero junction transistor $11a$, a second $Al_{y1}In_{y2}Ga_{1-y1-y2}N$ layer 15 forms a hetero junction 21 with a first $Al_{x1}In_{x2}Ga_{1-x1-x2}N$ layer $13a$. A first electrode 17 forms a Schottky junction with the first $Al_{x1}In_{x2}Ga_{1-x1-x2}N$ layer $13a$. The first $Al_{x1}In_{x2}Ga_{1-x1-x2}N$ layer $13a$ and the second $Al_{y1}In_{y2}Ga_{1-y1-y2}N$ layer 15 are provided over a substrate 23. The electrodes $17a$, $18a$, and $19a$ include a source electrode, a gate electrode, and a drain electrode, respectively. The carbon concentration NC13 in the first $Al_{x1}In_{x2}$ $Ga_{1-x1-x2}N$ layer $13a$ is less than $1\times10^{17}$ cm$^{-3}$. The dislocation density D in the second $Al_{y1}In_{y2}Ga_{1-y1-y2}N$ layer 15 is $1\times10^{8}$ cm$^{-2}$. The hetero junction 21 generates a two-dimensional electron gas layer 25. These provide a low-loss gallium nitride based electronic device.

14 Claims, 9 Drawing Sheets

(56) References Cited

FOREIGN PATENT DOCUMENTS

| JP | 2001-015437 | 1/2001 |
|----|----|----|
| JP | 2002-170776 | 6/2002 |
| JP | 2003-282929 | 10/2003 |
| JP | 2004-221325 | 8/2004 |
| JP | 2006-114655 A | 4/2006 |
| JP | 2006-261474 | 9/2006 |
| JP | 2006-278570 | 10/2006 |
| JP | 2006-295126 | 10/2006 |
| JP | 2007-027276 | 2/2007 |
| JP | 2009-507362 | 2/2009 |
| JP | 4462330 | 5/2010 |
| WO | WO-03/063215 A1 | 7/2003 |
| WO | WO-2006/126319 A1 | 11/2006 |
| WO | WO-2007/007589 A1 | 1/2007 |
| WO | WO-2007/013257 A1 | 2/2007 |
| WO | WO-2007/018653 A2 | 2/2007 |

OTHER PUBLICATIONS

Klein et al., "Observation of Deep Traps Responsible for Current Collapse in GaN Metal-Semiconductor Field Effect Transistors" Applied Physics Letters, Dec. 20, 1999, p. 4016-4018, vol. 75, No. 25.

Ohno, Y., "Development of High-Performance and High-Reliability GaN HEMTs," Technical Report of Industrial Technology Research Grant Program in 2004 (Final), 2004, New Energy and Industrial Technology Development Organization.

Chu et al., "9.4-W/mm Power Density AlGaN-GaN HEMTs on Free-Standing GaN Substrates," IEEE Electron Device Letters, vol. 25, No. 9, pp. 596-598 (Sep. 2004).

Miyoshi et al., "Improved Reverse Blocking Characteristics in AlGaN/GaN Schottky Barrier Diodes Based on AlN Template," Electronics Letters, vol. 43, No. 17, pp. 953-954 (Aug. 16, 2007).

* cited by examiner

Fig.5

| AlGaN GROWTH PRESSURE [torr] | C CONCENTRATION [cm$^{-3}$] | ON Sap. SUBSTRATE Tdd~2e9 | | ON SiC SUBSTRATE Tdd~5e8 | | ON GaN SUBSTRATE | | |
|---|---|---|---|---|---|---|---|---|
| | | | | | | Tdd~1e8 | | Tdd~5e6 |
| 50 | $3.2 \times 10^{18}$ | $2.2 \times 10^{-9}$ | 10.41 | $2.3 \times 10^{-10}$ | 50.45 | $1.8 \times 10^{-11}$ | 124.68 | $1.0 \times 10^{-12}$ | 654.38 |
| 75 | $1.4 \times 10^{18}$ | $4.4 \times 10^{-8}$ | 3.40 | $1.2 \times 10^{-9}$ | 8.37 | $8.6 \times 10^{-11}$ | 14.32 | $3.7 \times 10^{-12}$ | 21.56 |
| 100 | $3.4 \times 10^{17}$ | $3.0 \times 10^{-6}$ | 1.40 | $1.2 \times 10^{-7}$ | 1.94 | $2.1 \times 10^{-9}$ | 2.42 | $1.2 \times 10^{-11}$ | 3.54 |
| 150 | $9.7 \times 10^{16}$ | $8.9 \times 10^{-5}$ | 1.15 | $4.1 \times 10^{-6}$ | 1.21 | $3.3 \times 10^{-8}$ | 1.27 | $5.6 \times 10^{-11}$ | 1.30 |
| 200 | $2.9 \times 10^{16}$ | $9.2 \times 10^{-4}$ | 1.03 | $2.1 \times 10^{-5}$ | 1.05 | $8.6 \times 10^{-8}$ | 1.06 | $8.4 \times 10^{-11}$ | 1.08 |

Fig. 9

| AlGaN GROWTH PRESSURE [torr] | C CONCENTRATION [cm⁻³] | Si CONCENTRATION [cm⁻³] | ON Sap. SUBSTRATE Tdd~2e9 | | ON SiC SUBSTRATE Tdd~5e8 | | ON GaN SUBSTRATE Tdd~1e8 | | ON GaN SUBSTRATE Tdd~5e6 | |
|---|---|---|---|---|---|---|---|---|---|---|
| 100 | $3.4 \times 10^{17}$ | $3.1 \times 10^{16}$ | $3.9 \times 10^{-6}$ | 1.36 | $1.8 \times 10^{-7}$ | 1.84 | $3.1 \times 10^{-9}$ | 2.21 | $1.6 \times 10^{-11}$ | 2.95 |
| | | $1.1 \times 10^{17}$ | $1.4 \times 10^{-4}$ | 1.12 | $7.1 \times 10^{-6}$ | 1.16 | $6.3 \times 10^{-8}$ | 1.24 | $7.4 \times 10^{-11}$ | 1.28 |
| | | $3.7 \times 10^{17}$ | $2.1 \times 10^{-3}$ | 1.02 | $5.1 \times 10^{-5}$ | 1.04 | $2.8 \times 10^{-7}$ | 1.05 | $1.4 \times 10^{-10}$ | 1.07 | ially the same growth
III NITRIDE ELECTRONIC DEVICE AND III NITRIDE SEMICONDUCTOR EPITAXIAL SUBSTRATE

TECHNICAL FIELD

The present invention relates to a group III nitride electronic device and a group III nitride semiconductor epitaxial wafer.

BACKGROUND ART

Non-Patent Literature 1 discloses a hetero junction field-effect transistor (HFET). In order to provide the gallium nitride based HFET with a high output power performance, the occurrence of current collapse has to be reduced in the gallium nitride based electronic device. A cause of current collapse occurring in a gallium nitride based HFET driven with high frequency and large current is that electrons are trapped in the AlGaN region near the drain due to the effect of the electric field from the edge of the gate electrode. When trap levels in the AlGaN surface capture electrons, the captured electrons decrease the density of two-dimensional electron gas, which decreases output power. Non-Patent Literature 1 discloses an electric potential distribution measurements obtained by feeding voltage in the range of +100 V to −100 V to the device. The results of the measurement reveal the distribution of the electric potential in small areas of the device, where the application of stress voltage generates a negative potential in a region of the device due to the trapping of electrons in the AlGaN surface. The probability of electron emission from a trap level is associated with reverse leakage current of a Schottky electrode, and reducing this leakage current further enhances the current collapse.

Non-Patent Literature 2 shows that, in an AlGaN/GaN hetero-structure field-effect transistor, charging in its surface region is associated with current collapse.

[Non-Patent Literature 1] "Current collapse analysis of AlGaN/GaN HFET by plane KFM," Abstract of Debriefing Session of "Development of low-power-consumption high-frequency device" Project, pages 84-85.

[Non-Patent Literature 2] S. Sabuktagin et al. Appl. Phys. Lett. Vol. 86, 083506 (2005)

DISCLOSURE OF INVENTION

Problems to be Solved by the Invention

As shown in Non-Patent Literatures 1 and 2, the occurrence of the current collapse relates to the trapping of charges. As shown in non-Patent Literature 1, there is a trade-off relationship between the leakage current and the current collapse.

More specifically, fabricating a low-loss gallium nitride based electronic device requires a reduction in leakage current under the application of a reverse bias as well as suppression of current collapse under the application of a forward bias to reduce series resistance. Using process recipes for reducing the leakage current leads to increases in current collapse and thus series resistance. In contrast, using process recipes for reducing the current collapse leads to increases in leakage current. That is, they are in a trade-off relationship.

Progress in GaN based crystal fabrication technology has enabled the production of GaN wafers with low dislocation density. Progress in crystal growth technology has also enabled the fabrication of GaN templates with low dislocation density. On the GaN wafer or GaN template with low dislocation density, GaN based crystal with low dislocation density can be grown under substantially the same growth recipes as those for GaN based crystals grown on sapphire or silicon carbide substrates. The GaN based crystal with a low dislocation density also enables low leakage current in a gallium nitride based electronic device, but results in increase in the current collapse therein.

It is an object of the present invention to provide a low-loss group III nitride electronic device with reduced current collapse, and it is another object of the present invention to provide a group III nitride semiconductor epitaxial substrate suitable for a group III nitride electronic device.

Means for Solving the Problems

A group III nitride electronic device according to an aspect of the present invention comprises: (a) a first $Al_{X1}In_{X2}Ga_{1-X1-X2}N$ ($0<X1<1$, $0\leq X2<1$, $0<X1+X2<1$) layer; (b) a second $Al_{Y1}In_{Y2}Ga_{1-Y1-Y2}N$ ($0\leq Y1<1$, $0\leq Y2<1$, $0\leq Y1+Y2<1$) layer forming a hetero junction with the first $Al_{X1}In_{X2}Ga_{1-X1-X2}N$ layer; (c) a first electrode provided on the first $Al_{X1}In_{X2}Ga_{1-X1-X2}N$ layer; and (d) a second electrode provided on the first $Al_{X1}In_{X2}Ga_{1-X1-X2}N$ layer. The first $Al_{X1}In_{X2}Ga_{1-X1-X2}N$ layer is provided on the second $Al_{Y1}In_{Y2}Ga_{1-Y1-Y2}N$ layer. A band gap of the first $Al_{X1}In_{X2}Ga_{1-X1-X2}N$ layer is greater than that of the second $Al_{Y1}In_{Y2}Ga_{1-Y1-Y2}N$ layer. A carbon concentration in the first $Al_{X1}In_{X2}Ga_{1-X1-X2}N$ layer is less than $1\times10^{17}$ cm$^{-3}$. A dislocation density of the second $Al_{Y1}In_{Y2}Ga_{1-Y1-Y2}N$ layer is less than $1\times10^{8}$ cm$^{-2}$, and the first electrode forms a Schottky junction with the first $Al_{X1}In_{X2}Ga_{1-X1-X2}N$ layer.

Another aspect of the present invention is a group III nitride semiconductor epitaxial substrate for a group III nitride electronic device having a Schottky electrode, and the group III nitride semiconductor epitaxial substrate comprises: (a) a substrate; (b) a first $Al_{X1}In_{X2}Ga_{1-X1-X2}N$ ($0<X1<1$, $0\leq X2<1$, $0<X1+X2<1$) layer provided on the substrate; and (c) a second $Al_{Y1}In_{Y2}Ga_{1-Y1-Y2}N$ ($0\leq Y1<1$, $0\leq Y2<1$, $0\leq Y1+Y2<1$) layer provided on the substrate. The second $Al_{Y1}In_{Y2}Ga_{1-Y1-Y2}N$ layer forms a hetero junction with the first $Al_{X1}In_{X2}Ga_{1-X1-X2}N$ layer. The second $Al_{Y1}In_{Y2}Ga_{1-Y1-Y2}N$ layer is provided between the first $Al_{X1}In_{X2}Ga_{1-X1-X2}N$ layer and the substrate. A band gap of the first $Al_{X1}In_{X2}Ga_{1-X1-X2}N$ layer is greater than that of the second $Al_{Y1}In_{Y2}Ga_{1-Y1-Y2}N$ layer. A carbon concentration in the first $Al_{X1}In_{X2}Ga_{1-X1-X2}N$ layer is less than $1\times10^{17}$ cm$^{-3}$, and a dislocation density of the second $Al_{Y1}In_{Y2}Ga_{1-Y1-Y2}N$ layer is less than $1\times10^{8}$ cm$^{-2}$.

Carbon in a gallium nitride based semiconductor works as traps that capture carriers, so that a gallium nitride based semiconductor with carbon impurity has a reduced leakage current. Thus, the incorporation of carbon has been used to reduce the leakage current. However, since the second $Al_{Y1}In_{Y2}Ga_{1-Y1-Y2}N$ layer in the group III nitride electronic device and the group III nitride semiconductor epitaxial substrate has a dislocation density of less than $1\times10^{8}$ cm$^{-2}$, the amount of leakage current due to the dislocation is sufficiently low. Accordingly, even when the first $Al_{X1}In_{X2}Ga_{1-X1-X2}N$ layer having a carbon concentration of less than $1\times10^{17}$ cm$^{-3}$ is grown on the second $Al_{Y1}In_{Y2}Ga_{1-Y1-Y2}N$ layer, a increase in the leakage current is still made small. The number of electron trap levels is reduced in the first $Al_{X1}In_{X2}Ga_{1-X1-X2}N$ layer. In the group III nitride electronic device, the trap levels capture electrons in response to the application of voltage across the first and second electrodes. However, since the carbon impurity concentration in the first $Al_{X1}In_{X2}Ga_{1-X1-X2}N$ layer is less than $1\times10^{7}$ cm$^{-3}$, the number of electrons captured therein is also small, which lessens the effects of current collapse.

A group III nitride electronic device according to an aspect of the present invention comprises: (a) a first $Al_{X1}In_{X2}Ga_{1-X1-X2}N$ ($0<X1<1$, $0\leq X2<1$, $0<X1+X2<1$) layer; (b) a second $Al_{Y1}In_{Y2}Ga_{1-Y1-Y2}N$ ($0\leq Y1<1$, $0\leq Y2<1$, $0\leq Y1+Y2<1$) layer forming a hetero junction with the first $Al_{X1}In_{X2}Ga_{1-X1-X2}N$ layer; (c) a first electrode provided on the first $Al_{X1}In_{X2}Ga_{1-X1-X2}N$ layer; and (d) second electrode provided on the first $Al_{X1}In_{X2}Ga_{1-X1-X2}N$ layer. The first $Al_{X1}In_{X2}Ga_{1-X1-X2}N$ layer is provided on the second $Al_{Y1}In_{Y2}Ga_{1-Y1-Y2}N$ layer. A band gap of the first $Al_{X1}In_{X2}Ga_{1-X1-X2}N$ layer is greater than that of the second $Al_{Y1}In_{Y2}Ga_{1-Y1-Y2}N$ layer. A silicon concentration in the first $Al_{X1}In_{X2}Ga_{1-X1-X2}N$ layer is $1\times10^{17}$ cm$^{-3}$ or higher. A dislocation density of the second $Al_{Y1}In_{Y2}Ga_{1-Y1-Y2}N$ layer is less than $1\times10^8$ cm$^{-2}$, and the first electrode forms a Schottky junction with the first $Al_{X1}In_{X2}Ga_{1-X1-X2}N$ layer.

Another aspect of the present invention is a group III nitride semiconductor epitaxial substrate for a group III nitride electronic device containing a Schottky electrode, the group III nitride semiconductor epitaxial substrate comprises: (a) a substrate; (b) a first $Al_{X1}In_{X2}Ga_{1-X1-X2}N$ ($0<X1<1$, $0\leq X2<1$, $0<X1+X2<1$) layer provided on the substrate; and (c) a second $Al_{Y1}In_{Y2}Ga_{1-Y1-Y2}N$ ($0\leq Y1<1$, $0\leq Y2<1$, $0\leq Y1+Y2<1$) layer provided on the substrate. The second $Al_{Y1}In_{Y2}Ga_{1-Y1-Y2}N$ layer forms a hetero junction with the first $Al_{X1}In_{X2}Ga_{1-X1-X2}N$ layer. The second $Al_{Y1}In_{Y2}Ga_{1-Y1-Y2}N$ layer is provided between the first $Al_{X1}In_{X2}Ga_{1-X1-X2}N$ layer and the substrate. A band gap of the first $Al_{X1}In_{X2}Ga_{1-X1-X2}N$ layer is greater than that of the second $Al_{Y1}In_{Y2}Ga_{1-Y1-Y2}N$ layer. A silicon concentration in the first $Al_{X1}In_{X2}Ga_{1-X1-X2}N$ layer is $1\times10^{17}$ cm$^{-3}$ or higher; and a dislocation density of the second $Al_{Y1}In_{Y2}Ga_{1-Y1-Y2}N$ layer is less than $1\times10^8$ cm$^{-2}$.

Silicon in a gallium nitride based semiconductor works as donors that provide carriers, so that a silicon-doped gallium nitride based semiconductor has a reduced electrical resistivity. Thus, when a gallium nitride based semiconductor has a large dislocation density and is doped with silicon that provides carriers, an amount of leakage current is made large therein. When the group III nitride electronic device and the group III nitride semiconductor epitaxial substrate have a dislocation density of less than $1\times10^8$ cm$^{-2}$ in the second $Al_{Y1}In_{Y2}Ga_{1-Y1-Y2}N$ layer, leakage current due to the dislocation is sufficiently low. Accordingly, even when the first $Al_{X1}In_{X2}Ga_{1-X1-X2}N$ layer having a silicon concentration of $1\times10^{17}$ cm$^{-3}$ or higher is grown on the second $Al_{Y1}In_{Y2}Ga_{1-Y1-Y2}N$ layer, the leakage current shows only a slight increase. Thus, the relaxation time of electrons that the trap levels capture is small in the first $Al_{X1}In_{X2}Ga_{1-X1-X2}N$ layer. In the group III nitride electronic device, the trap levels capture electrons in response to the application of voltage across the first and second electrodes. However, since the silicon concentration in the first $Al_{X1}In_{X2}Ga_{1-X1-X2}N$ layer is $1\times10^{17}$ cm$^{-3}$ or higher, the trapped electrons are released within a short period of time after the applied voltage has been removed. This lessens the effects of current collapse.

A group III nitride electronic device according to an aspect of the present invention comprises: (a) a first $Al_{X1}In_{X2}Ga_{1-X1-X2}N$ ($0<X1<1$, $0\leq X2<1$, $0<X1+X2<1$) layer; (b) a second $Al_{Y1}In_{Y2}Ga_{1-Y1-Y2}N$ ($0\leq Y1<1$, $0\leq Y2<1$, $0\leq Y1+Y2<1$) layer forming a hetero junction with the first $Al_{X1}In_{X2}Ga_{1-X1-X2}N$ layer; (c) a first electrode provided on the first $Al_{X1}In_{X2}Ga_{1-X1-X2}N$ layer; and (d) a second electrode provided on the first $Al_{X1}In_{X2}Ga_{1-X1-X2}N$ layer. The first $Al_{X1}In_{X2}Ga_{1-X1-X2}N$ layer is provided on the second $Al_{Y1}In_{Y2}Ga_{1-Y1-Y2}N$ layer. A band gap of the first $Al_{X1}In_{X2}Ga_{1-X1-X2}N$ layer is greater than that of the second $Al_{Y1}In_{Y2}Ga_{1-Y1-Y2}N$ layer. A silicon concentration in the first $Al_{X1}In_{X2}Ga_{1-X1-X2}N$ layer is higher than a carbon concentration in the first $Al_{X1}In_{X2}Ga_{1-X1-X2}N$ layer. A dislocation density of the second $Al_{Y1}In_{Y2}Ga_{1-Y1-Y2}N$ layer is less than $1\times10^8$ cm$^{-2}$; and the first electrode forms a Schottky junction with the first $Al_{X1}In_{X2}Ga_{1-X1-X2}N$ layer.

Another aspect of the present invention is a group III nitride semiconductor epitaxial substrate for a group III nitride electronic device with a Schottky electrode, the group III nitride semiconductor epitaxial substrate comprises: (a) a substrate; (b) a first $Al_{X1}In_{X2}Ga_{1-X1-X2}N$ ($0<X1<1$, $0\leq X2<1$, $0<X1+X2<1$) layer provided on the substrate; and (c) a second $Al_{Y1}In_{Y2}Ga_{1-Y1-Y2}N$ ($0\leq Y1<1$, $0\leq Y2<1$, $0\leq Y1+Y2<1$) layer provided over the substrate. The second $Al_{Y1}In_{Y2}Ga_{1-Y1-Y2}N$ layer forms a hetero junction with the first $Al_{X1}In_{X2}Ga_{1-X1-X2}N$ layer. The second $Al_{Y1}In_{Y2}Ga_{1-Y1-Y2}N$ layer is provided between the first $Al_{X1}In_{X2}Ga_{1-X1-X2}N$ layer and the substrate. A band gap of the first $Al_{X1}In_{X2}Ga_{1-X1-X2}N$ layer is greater than that of the second $Al_{Y1}In_{Y2}Ga_{1-Y1-Y2}N$ layer. A silicon concentration in the first $Al_{X1}In_{X2}Ga_{1-X1-X2}N$ layer being higher than a carbon concentration in the first $Al_{X1}In_{X2}Ga_{1-X1-X2}N$ layer, and a dislocation density of the second $Al_{Y1}In_{Y2}Ga_{1-Y1-Y2}N$ layer is less than $1\times10^8$ cm$^{-2}$.

Carbon in a gallium nitride based semiconductor works as traps that carriers capture, so that a gallium nitride based semiconductor with carbon impurity can reduce leakage current. Thus, the incorporation of carbon has been used to reduce the leakage current. Silicon in a gallium nitride based semiconductor works as donors that provide carriers, so that doping a gallium nitride based semiconductor with silicon can lower its resistivity. Thus, when a gallium nitride based semiconductor has a large dislocation density and is doped with silicon that provides carriers, the leakage current is made large therein. When the group III nitride electronic device and the group III nitride semiconductor epitaxial substrate have a dislocation density of less than $1\times10^8$ cm$^{-2}$ in the second $Al_{Y1}In_{Y2}Ga_{1-Y1-Y2}N$ layer, the leakage current due to the dislocation is sufficiently low. Accordingly, even when the silicon concentration in the first $Al_{X1}In_{X2}Ga_{1-X1-X2}N$ layer is enriched so as to be higher than the carbon concentration, the leakage current shows only a slight increase. Current collapse due to the trapping of electrons by the addition of carbon is also reduced by silicon of the concentration higher than the concentration of carbon therein.

In the group III nitride electronic device, the group III nitride semiconductor epitaxial substrate and the group III nitride semiconductor substrate product according to the above aspects of the invention, the carbon concentration in the first $Al_{X1}In_{X2}Ga_{1-X1-X2}N$ layer is preferably $1\times10^{17}$ cm$^{-3}$ or higher.

In the group III nitride electronic device, the group III nitride semiconductor epitaxial substrate, and the group III nitride semiconductor substrate product, the first $Al_{X1}In_{X2}Ga_{1-X1-X2}N$ layer with a carbon concentration of $1\times10^{17}$ cm$^{-3}$ or higher has low leakage current due to a large number of electron trap levels that originate from carbon atoms therein. Adjusting the silicon concentration to a level higher than the carbon concentration enables the control of properties such as leakage current of the first $Al_{X1}In_{X2}Ga_{1-X1-X2}N$ layer. Consequently, the occurrence of current collapse due to the trapping of electron is reduced by silicon of the concentration higher than the concentration of carbon.

In the group III nitride electronic device of the invention, the first $Al_{X1}In_{X2}Ga_{1-X1-X2}N$ layer includes an AlGaN barrier layer; the group III nitride electronic device includes a hetero junction transistor; the first electrode includes a gate electrode of the hetero junction transistor; the second electrode includes a drain electrode of the transistor; and the group III nitride electronic device further includes a source electrode provided on the first $Al_{X1}In_{X2}Ga_{1-X1-X2}N$ layer. The group III nitride electronic device can reduce the occurrence of current collapse in the hetero junction transistor without a large increase in leakage current.

In the group III nitride electronic device, the group III nitride semiconductor epitaxial substrate and the group III nitride semiconductor substrate product of the present invention, the first $Al_{X1}In_{X2}Ga_{1-X1-X2}N$ layer includes an AlGaN barrier layer; the group III nitride electronic device includes a transistor containing a hetero junction; and the Schottky electrode includes a gate electrode of the transistor. According to the group III nitride electronic device, the group III nitride semiconductor epitaxial substrate and the group III nitride semiconductor substrate product, the hetero junction transistor can be provided which exhibits reduced current collapse without a large increase in leakage current.

In the group III nitride electronic device, the group III nitride semiconductor epitaxial substrate, and the group III nitride semiconductor substrate product of the present invention, the first $Al_{X1}In_{X2}Ga_{1-X1-X2}N$ layer includes an AlGaN layer; the group III nitride electronic device includes a Schottky barrier diode; the first electrode includes an anode of the Schottky barrier diode; and the second electrode includes a cathode of the Schottky barrier diode. According to the group III nitride electronic device, the group III nitride semiconductor epitaxial substrate and the group III nitride semiconductor substrate product, the occurrence of current collapse in a Schottky barrier diode can be reduced without a large increase in leakage current. According to the group III nitride semiconductor epitaxial substrate, the Schottky barrier diode is provided which lessens the occurrence of current collapse without a large increase in leakage current.

In the group III nitride electronic device, the group III nitride semiconductor epitaxial substrate and the group III nitride semiconductor substrate product according to the above aspects of the invention, the second $Al_{Y1}In_{Y2}Ga_{1-Y1-Y2}N$ layer is preferably composed of GaN. The group III nitride electronic device and the group III nitride semiconductor substrate product can comprise a high-quality GaN crystal and thus reduce leakage current.

The group III nitride electronic device, the group III nitride semiconductor epitaxial substrate, and the group III nitride semiconductor substrate product according to the above aspects of the invention may further include a GaN substrate having a dislocation density of $1\times10^8$ cm$^{-2}$ or less. It is preferable that the second $Al_{Y1}In_{Y2}Ga_{1-Y1-Y2}N$ layer be provided on the GaN substrate and that the first $Al_{X1}In_{X2}Ga_{1-X1-X2}N$ layer be provided on the second $Al_{Y1}In_{Y2}Ga_{1-Y1-Y2}N$ layer. In the group III nitride electronic device, the group III nitride semiconductor epitaxial substrate and the group III nitride semiconductor substrate product, the dislocation density of the GaN substrate is low, so that the GaN substrate with a low dislocation density makes the leakage current due to the dislocation small. Regardless of the low leakage current, the current collapse can be reduced.

In the group III nitride electronic device, the group III nitride semiconductor epitaxial substrate and the group III nitride semiconductor substrate product according to the above aspects of the invention, the GaN substrate may be composed of semi-insulating material. The group III nitride electronic device, the group III nitride semiconductor epitaxial substrate and the group III nitride semiconductor substrate product can provide an electronic device with excellent high-frequency performances.

The group III nitride electronic device, the group III nitride semiconductor epitaxial substrate and the group III nitride semiconductor substrate product according to the above aspects of the invention may further include a GaN template having a dislocation density of $1\times10^8$ cm$^{-2}$ or less. The second $Al_{Y1}In_{Y2}Ga_{1-Y1-Y2}N$ layer is provided on the GaN template; and the first $Al_{X1}In_{X2}Ga_{1-X1-X2}N$ layer is provided on the second $Al_{Y1}In_{Y2}Ga_{1-Y1-Y2}N$ layer. In the group III nitride electronic device, the group III nitride semiconductor epitaxial substrate and the group III nitride semiconductor substrate product, the dislocation density of the GaN template is low, so that the GaN template with a low dislocation density makes the leakage current due to the dislocation small. Regardless of the low leakage current, the current collapse can be reduced.

The foregoing and other objects, features, and advantages of the present invention will become more readily apparent from the following detailed description of a preferred embodiment of the invention, which proceeds with reference to the accompanying drawings.

Advantageous Effects of Invention

The present invention, as described above, provides a low-loss group III nitride electronic device with reduced current collapse, and also provides a group III nitride semiconductor epitaxial substrate suitable for a low-loss group III nitride electronic device.

BRIEF DESCRIPTION OF DRAWINGS

FIG. 5 is a view including a table that indicates the relationship between carbon concentration and current collapse.

FIG. 9 is a view including a table that indicates the relationship between leakage current density and current collapse with respect to the incorporation of silicon.

LIST OF REFERENCE SYMBOLS 11, 11a, 11b, and 11c: group III nitride electronic device;
13, 13a, 13b, and 13c: first $Al_{X1}In_{X2}Ga_{1-X1-X2}N$ layer;
15: second $Al_{Y1}In_{Y2}Ga_{1-Y1-Y2}N$ layer;
17: first electrode;
19: second electrode;
17a, 18a, and 19a: electrode;
21: hetero junction;
23: substrate;
25: two-dimensional electron gas layer;
31: epitaxial substrate;

33: high-resistance GaN substrate;
35: undoped GaN layer;
37: $Al_{0.25}Ga_{0.75}N$ layer;
E1, E2, E3, and E4: group III nitride semiconductor epitaxial substrate;
$N_{Si13}$: silicon concentration.

DESCRIPTION OF BEST EMBODIMENTS

The teaching of the present invention can readily be understood from the following detailed description with reference to the accompanying drawings by way of examples. Embodiments of a group III nitride electronic device, a group III nitride semiconductor epitaxial substrate, and a group III nitride semiconductor substrate product according to the invention will now be described with reference to the accompanying drawings. The use of the same reference symbols in different drawings indicates similar or identical items, if possible.

Figure 1:
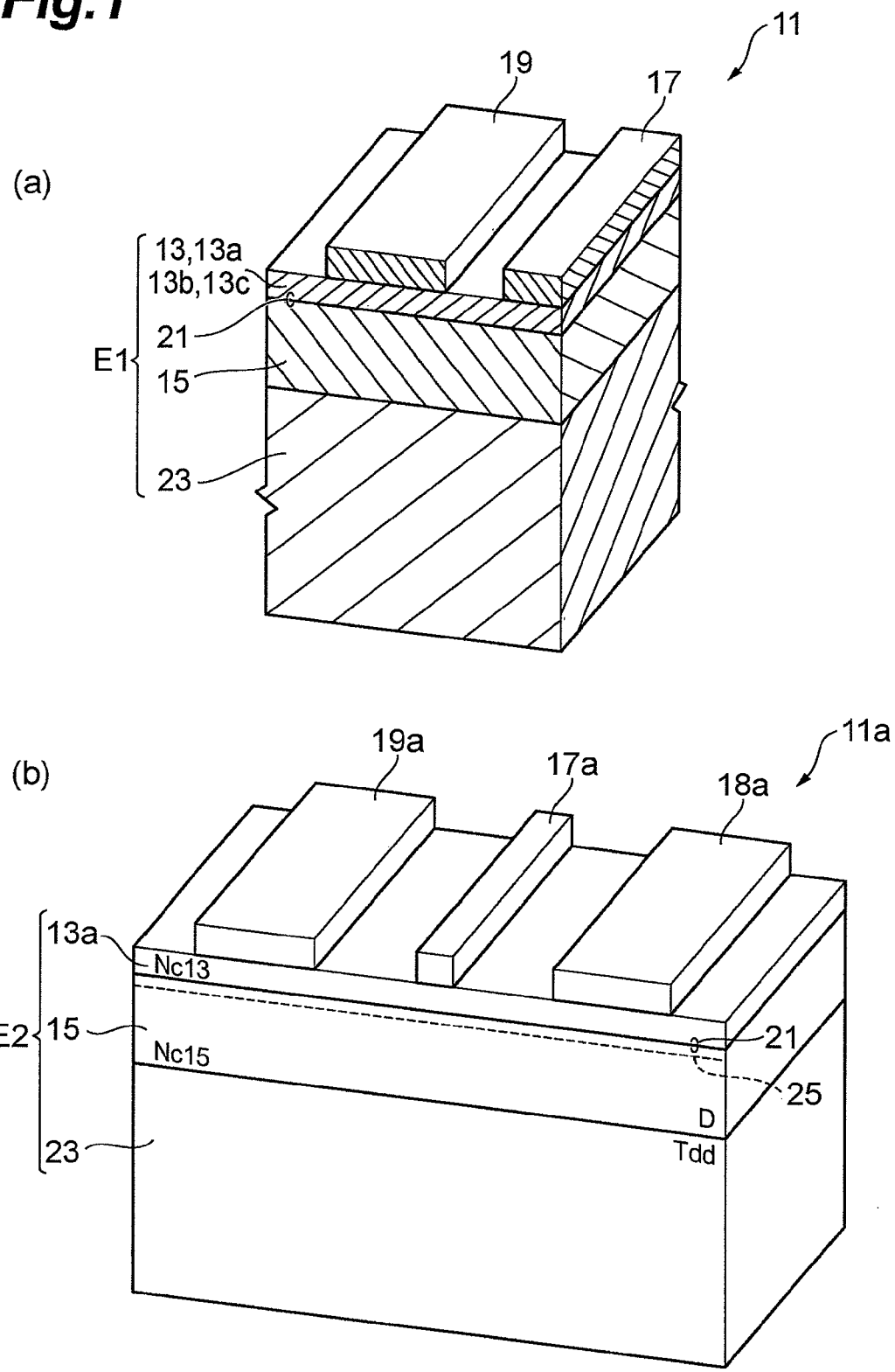
FIG. 1 is a view including schematic diagrams that show structures of a group III gallium nitride based hetero junction transistor and a group III nitride semiconductor epitaxial substrate for a group III nitride electronic device with a Schottky electrode according to an embodiment.

Part (a) of FIG. 1 illustrates the structure of a group III nitride electronic device, a group III nitride semiconductor epitaxial substrate, and a group III nitride semiconductor substrate product according to an embodiment. The group III nitride electronic device 11 includes a first $Al_{X1}In_{X2}Ga_{1-X1-X2}N$ (0<X1<1, 0≦X2<1, 0<X1+X2<1) layer 13 (13a, 13b, 13c), a second $Al_{Y1}In_{Y2}Ga_{1-Y1-Y2}N$ (0≦Y1<1, 0≦Y2<1, 0≦Y1+Y2<1) layer 15, a first electrode 17 and a second electrode 19. The second $Al_{Y1}In_{Y2}Ga_{1-Y1-Y2}N$ layer 15 and the first $Al_{X1}In_{X2}Ga_{1-X1-X2}N$ layer 13 constitute a hetero junction 21. The first electrode 17 is provided on the first $Al_{X1}In_{X2}Ga_{1-X1-X2}N$ layer 13 and is in contact with the first $Al_{X1}In_{X2}Ga_{1-X1-X2}N$ layer 13 to form a junction. The second electrode 19 is provided on the first $Al_{X1}In_{X2}Ga_{1-X1-X2}N$ layer and is in contact with the first $Al_{X1}In_{X2}Ga_{1-X1-X2}N$ layer 13 to form a junction. The band gap of the first $Al_{X1}In_{X2}Ga_{1-X1-X2}N$ layer 13 is greater than that of the second $Al_{Y1}In_{Y2}Ga_{1-Y1-Y2}N$ layer 15. The first electrode 17 forms a Schottky junction with the first $Al_{X1}In_{X2}Ga_{1-X1-X2}N$ layer 13. The first electrode 17 is provided on the first $Al_{X1}In_{X2}Ga_{1-X1-X2}N$ layer 13 and the second $Al_{Y1}In_{Y2}Ga_{1-Y1-Y2}N$ layer 15, and is also provided on the substrate 23.

Part (a) of FIG. 1 illustrates a part of a group III nitride semiconductor epitaxial substrate for a group III nitride electronic device that includes a Schottky electrode, and the electrodes 17 and 19 for the group III nitride electronic device 11 are provided on the primary surface of the group III nitride semiconductor epitaxial substrate E1. The group III nitride semiconductor substrate product includes this group III nitride semiconductor epitaxial substrate, and the electrodes 17 and 19 provided thereon.

In a preferred embodiment, the group III nitride based electronic device 11 includes, for example, a hetero junction transistor or a Schottky barrier diode. A reverse bias is applied to the first electrode 17 in a certain period of time during the operation of the group III nitride electronic device 11, whereas, in a period of time in which a forward bias is applied to the first electrode 17 during the operation of the group III nitride electronic device 11, the second electrode 19 supplies carriers that pass through the group III nitride electronic device 11. Thus, the second electrode 19 preferably forms an ohmic contact with the first $Al_{X1}In_{X2}Ga_{1-X1-X2}N$ layer 13. Examples of combinations of materials used for the first $Al_{X1}In_{X2}Ga_{1-X1-X2}N$ layer 13 and the second $Al_{Y1}In_{Y2}Ga_{1-Y1-Y2}N$ layer 15 encompass as follows: AlGaN/GaN, AlGaN/InGaN, $Al_{X1}Ga_{1-X1}N/Al_{Y1}Ga_{1-Y1}N$ (X1>Y1>0); and InAlN/GaN. The first $Al_{X1}In_{X2}Ga_{1-X1-X2}N$ layer 13 and the second $Al_{Y1}In_{Y2}Ga_{1-Y1-Y2}N$ layer 15 are grown, for example, by metal organic chemical vapor deposition.

When the group III nitride electronic device 11 operates as a hetero junction transistor, the first electrode 17 functions as a gate electrode and the second electrode 19 functions as a source electrode and a drain electrode. When the group III nitride electronic device 11 operates as a Schottky barrier diode, the first electrode 17 functions as an anode and the second electrode 19 functions as a cathode. Both of these electronic devices are lateral electronic devices in which the current flows in the surface regions of the gallium nitride based semiconductor layers. Therefore, electric characteristics of the group III nitride electronic device 11 are sensitive to charges trapped in the surface region of the gallium nitride based semiconductor layers.

As an example of the group III nitride electronic device according to the embodiment, a hetero junction transistor will now be described with reference to Part (b) of FIG. 1, Part (a) of FIG. 2, and Part (b) of FIG. 2.

Part (b) of FIG. 1 is a drawing schematically illustrating the structure of a group III nitride hetero junction transistor according to an embodiment. The group III nitride hetero junction transistor (referred to as "transistor" hereafter) 11a includes a first $Al_{X1}In_{X2}Ga_{1-X1-X2}N$ layer 13a, a second $Al_{Y1}In_{Y2}Ga_{1-Y1-Y2}N$ layer 15 and electrodes 17a, 18a and 19a. The transistor 11a includes the first $Al_{X1}In_{X2}Ga_{1-X1-X2}N$ layer 13a instead of the first $Al_{X1}In_{X2}Ga_{1-X1-X2}N$ layer 13. The carbon concentration $N_{C13}$ in the first $Al_{X1}In_{X2}Ga_{1-X1-X2}N$ layer 13a is less than $1 \times 10^{17}$ cm$^{-3}$. The dislocation density D of the second $Al_{Y1}In_{Y2}Ga_{1-Y1-Y2}N$ layer 15 can be $1 \times 10^8$ cm$^{-2}$. The hetero junction 21 generates a two-dimensional electron gas layer 25. The electrodes 17a, 18a, and 19a correspond to a gate electrode, a source electrode, and a drain electrode, respectively. The arrangement of the electrodes 17a, 18a, and 19a is formed on the group III nitride semiconductor epitaxial substrate E2, and the group III nitride semiconductor epitaxial substrate E2 also includes components that correspond to the first $Al_{X1}In_{X2}Ga_{1-X1-X2}N$ layer 13a, the second $Al_{Y1}In_{Y2}Ga_{1-Y1-Y2}N$ layer 15, and the substrate 23.

Carbon atoms in a gallium nitride based semiconductor create levels that capture carriers, so that the gallium nitride based semiconductor with carbon impurity has a reduced leakage current. Thus, the carbon doping has been used to reduce the leakage current. But, the transistor 11a and the group III nitride semiconductor epitaxial substrate E2 have a dislocation density of less than $1 \times 10^8$ cm$^{-2}$ in the second $Al_{Y1}In_{Y2}Ga_{1-Y1-Y2}N$ layer 15, so that leakage current due to the dislocation is sufficiently low. Accordingly, even when the carbon concentration in the first $Al_{X1}In_{X2}Ga_{1-X1-X2}N$ layer 13a grown thereon is reduced to a level of less than approximately $1 \times 10^{17}$ cm$^{-3}$, a increase in the leakage current is made small to be within an acceptable range. Since the carbon concentration $N_{C13}$ in the first $Al_{X1}In_{X2}Ga_{1-X1-X2}N$ layer 13a is less than $1 \times 10^{17}$ cm$^{-3}$, the number of electron trap levels formed by incorporation of carbon is reduced. Although the application of voltage through the second electrode 18a traps electrons in the trap levels in the $Al_{X1}In_{X2}Ga_{1-X1-X2}N$ layer 13a near the gate electrode, reducing the carbon concentration makes the number of electron traps small. This reduces the effects of current collapse.

The substrate 23 has a threading dislocation density Tdd. It is preferred that the dislocation density Tdd be, for example, less than $1 \times 10^8$ cm$^{-2}$. Examples of materials for the substrate 23 encompass GaN, AlN, AlGaN, and InGaN.

Figure 2:
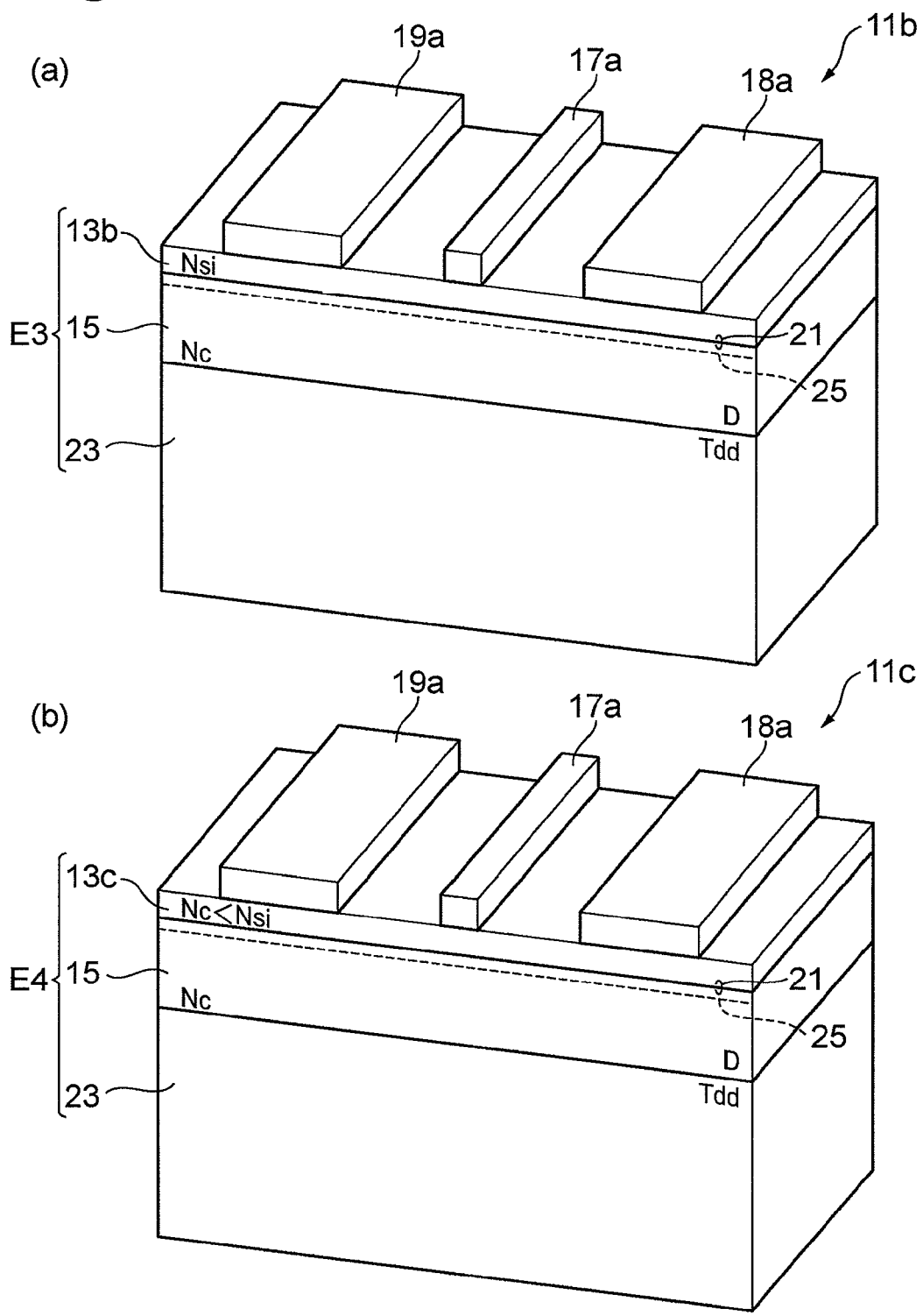
FIG. 2 is a view including schematic diagrams that show structures of a group III gallium nitride based hetero junction transistor according to an embodiment.

Part (a) of FIG. 2 is a drawing schematically illustrating the structure of a group III nitride hetero junction transistor according to an embodiment. The group III nitride hetero junction transistor 11b (referred to as "transistor 11b" hereafter) includes a first $Al_{X1}In_{X2}Ga_{1-X1-X2}N$ layer 13b, a second $Al_{Y1}In_{Y2}Ga_{1-Y1-Y2}N$ layer 15 and electrodes 17a, 18a and 19a. The transistor 11b includes the first $Al_{X1}In_{X2}Ga_{1-X1-X2}N$ layer 13b instead of the first $Al_{X1}In_{X2}Ga_{1-X1-X2}N$ layer 13. The group III nitride semiconductor epitaxial substrate E3 includes components that correspond to the first $Al_{X1}In_{X2}Ga_{1-X1-X2}N$ layer 13b, the second $Al_{Y1}In_{Y2}Ga_{1-Y1-Y2}N$ layer 15 and the substrate 23, and the arrangement of the electrodes 17a, 18a, and 19a is formed on the primary surface of the group III nitride semiconductor epitaxial substrate E3. The silicon concentration $N_{Si13}$ in the first $Al_{X1}In_{X2}Ga_{1-X1-X2}N$ layer 13b is $1\times10^{17}$ cm$^3$ or higher.

Silicon in a gallium nitride based semiconductor provides carriers, so that a silicon-doped gallium nitride based semiconductor has a reduced resistivity. When a gallium nitride based semiconductor has a large dislocation density, carriers provided by silicon therein leads to a large amount of leakage current. But, the group III nitride electronic device 11b and the group III nitride semiconductor epitaxial substrate E3 have a dislocation density D of less than $1\times10^8$ cm$^{-2}$ in the second $Al_{Y1}In_{Y2}Ga_{1-Y1-Y2}N$ layer 15, so that leakage current due to the dislocation is made sufficiently low. Accordingly, even when the first $Al_{X1}In_{X2}Ga_{1-X1-X2}N$ layer 13b is grown on the second layer and has the silicon concentration $N_{Si13}$ of $1\times10^{17}$ cm$^{-3}$ or higher, the leakage current exhibits only a slight increase. Thus, the relaxation time of the electrons captured in the trap levels is small in the first $Al_{X1}In_{X2}Ga_{1-X1-X2}N$ layer 13b. Although the trap levels capture electrons in the first $Al_{X1}In_{X2}Ga_{1-X1-X2}N$ layer 13b near the gate electrode in response to the application of voltage through the first and second electrodes 17a and 19a, the trapped electrons are released within a short period of time after the applied voltage has been removed because the silicon concentration in the first $Al_{X1}In_{X2}Ga_{1-X1-X2}N$ layer 13b is $1\times10^{17}$ cm$^{-3}$ or higher. Therefore, the effects of current collapse are moderated. The silicon concentration $N_{Si13}$ is preferably $1\times10^{19}$ cm$^{-3}$ or less.

Part (b) of FIG. 2 is a schematic view illustrating the structure of a group III nitride hetero junction transistor according to an embodiment. The group III nitride hetero junction transistor 11c (referred to as "transistor 11c" hereafter) includes a first $Al_{X1}In_{X2}Ga_{1-X1-X2}N$ layer 13c, a second $Al_{Y1}In_{Y2}Ga_{1-Y1-Y2}N$ layer 15 and electrodes 17a, 18a and 19a. The transistor 11c includes the first $Al_{X1}In_{X2}Ga_{1-X1-X2}N$ layer 13c instead of the first $Al_{X1}In_{X2}Ga_{1-X1-X2}N$ layer 13. The group III nitride semiconductor epitaxial substrate E4 includes components that correspond to the first $Al_{X1}In_{X2}Ga_{1-X1-X2}N$ layer 13c, the second $Al_{Y1}In_{Y2}Ga_{1-Y1-Y2}N$ layer 15, and the substrate 23. In the group III nitride semiconductor substrate product, the arrangement of the electrodes 17a, 18a, and 19a is formed on the primary surface of the group III nitride semiconductor epitaxial substrate E4.

As already described above, carbon in a gallium nitride based semiconductor works as traps that carriers capture, whereas silicon in a gallium nitride based semiconductor works as donors that provide carriers. Carbon is incorporated in a gallium nitride based semiconductor, and trap levels formed by the incorporated carbon can capture carriers, leading to worsening current collapse. But, the gallium nitride based semiconductor is doped with silicon at a concentration higher than that of carbon, so that the number of carriers is greater than the number of trap levels, leading to a reduced resistivity. Therefore, after the applied voltage is removed, the trapped electrons are released in a short period of time. This moderates the effects of current collapse. The transistor 11c and the group III nitride semiconductor epitaxial substrate E4 have a dislocation density of less than $1\times10^8$ cm$^{-2}$ in the second $Al_{Y1}In_{Y2}Ga_{1-Y1-Y2}N$ layer 15, so that leakage current due to the dislocation is sufficiently low. Accordingly, in the first $Al_{X1}In_{X2}Ga_{1-X1-X2}N$ layer 13c having the silicon concentration higher than its carbon concentration, increase in the leakage current is made slight.

The relationship described above (the relationship between the current collapse and the carbon concentration) has been discovered by the inventors through the following experiments.

EXEMPLARY EXPERIMENTS

Experiment 1

An epitaxial substrate was fabricated on a (0001) sapphire substrate by metal organic vapor phase epitaxy (MOVPE) as follows. The substrate was heat-treated in a hydrogen atmosphere at a temperature of 1050° C. under a reactor pressure of 100 torr (1 torr corresponds to 133.322 Pa) for 5 minutes. After this treatment, a low-temperature GaN buffer layer (25 nm) is grown at a temperature of 520° C. Then, an undoped 2-μm GaN layer was grown at a temperature of 1050° C. under a reactor pressure of 100 torr with V/III=1000. Then, an undoped $Al_{0.25}Ga_{0.75}N$ layer was grown at a temperature of 1070° C. under a reactor pressure of 50 torr with V/III=500. These processes produced an epitaxial substrate A-1. The threading dislocation density in the GaN layer was $2\times10^9$ cm$^{-2}$, which was evaluated through TEM.

Experiment 2

An epitaxial substrate was fabricated on a 6H—SiC substrate by MOVPE as follows. The substrate was heat-treated in a hydrogen atmosphere at a temperature of 1050° C. under a reactor pressure of 100 torr for 5 minutes. After this treatment, an undoped $Al_{0.5}Ga_{0.5}N$ buffer layer (100 nm) was grown at a temperature of 1080° C. Then, a 2-μm undoped GaN layer was grown at a temperature of 1050° C. under a reactor pressure of 100 torr with V/III=1000. Then, a 25-nm undoped $Al_{0.25}Ga_{0.75}N$ layer was grown at a temperature of 1070° C. under a reactor pressure of 50 torr with V/III=500. These processes produced an epitaxial substrate B-1. The dislocation density in the GaN layer was $5\times10^8$ cm$^{-2}$, which was evaluated through TEM.

Experiment 3

Figure 3:
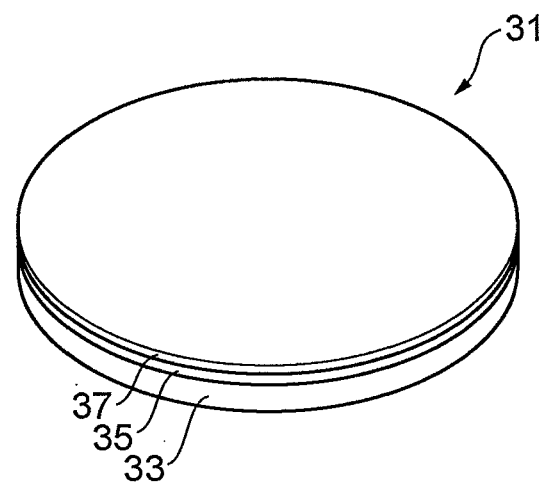
FIG. 3 is a diagram showing the structure of an epitaxial substrate.

An epitaxial substrate 31 as shown in FIG. 3 was fabricated by MOVPE as follows. A high-resistance GaN substrate 33 was treated in an ammonia atmosphere at a temperature of 1000° C. for 5 minutes. After this treatment, a 2-μm undoped GaN layer 35 was grown at a temperature of 1050° C. under a reactor pressure of 100 torr with V/III=1000. Then, a 25-nm undoped $Al_{0.25}Ga_{0.75}N$ layer 37 was grown at a temperature of 1070° C. under a reactor pressure of 50 torr with V/III=500. These processes produced epitaxial substrates C-1 and D-1. The dislocation density in the GaN layer of the epitaxial substrate C-1 was $1\times10^8$ cm$^{-2}$, and the dislocation density in the GaN layer of the epitaxial substrate D-1 was $5\times10^6$ cm$^{-2}$, which were evaluated through TEM.

AlGaN layers were grown under various growth pressures as in the experiments described above. Epitaxial wafers A-2 through E-2 were fabricated under a growth pressure of 75 torr. Epitaxial wafers A-3 through E-3 were fabricated under a growth pressure of 100 torr. Epitaxial wafers A-4 through E-4 were fabricated under a growth pressure of 150 torr. Epitaxial wafers A-5 through E-5 were fabricated under a growth pressure of 200 torr.

In order to evaluate the leakage current Igs (current between gate and source) and the current collapse under reverse bias, electrodes (gate electrode, source electrode and drain electrode) were formed on each epitaxial substrate to fabricate a transistor of a HEMT structure. The gate electrode had a ring shape with a gate width Wg of 0.5 mm and a drain-gate distance Lgd of 10 μm, and the drain electrode is located inside the ring whereas the source electrode is located outside the ring to surround it.

In order to evaluate the state of current collapse, the first measurement of on-resistance was carried out before applying a reverse bias and the second measurement of on-resistance was carried out after a voltage Vds of 100 V had been applied for 5 minutes. The current collapse was defined as the ratio of the above two on-resistance values (on-resistance after biasing/on-resistance before biasing). If the current collapse does not occur, this on-resistance ratio is equal to one. If the current collapse occurs, the on-resistance ratio is greater than one. The leakage current is defined by Igs (current between the gate and the source) measured at an applied voltage Vds of 100 V.

Figure 4:
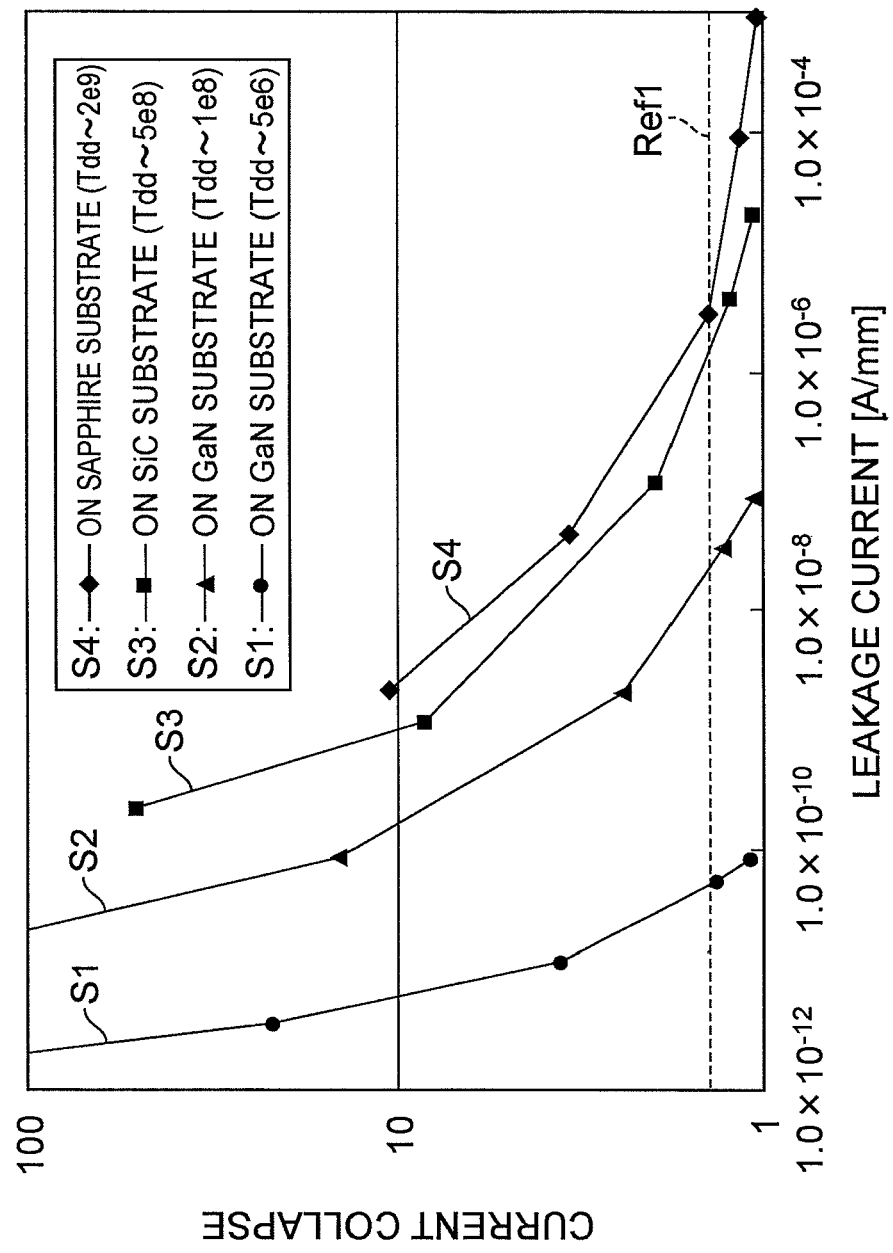
FIG. 4 is a graph showing the relationship between leakage current density and current collapse with respect to incorporation of carbon.

FIG. 4 shows the experimental results. FIG. 4 indicates characteristic curves: C1, C2, C3, and C4. FIG. 5 summarizes the experimental results shown in FIG. 4. FIG. 5 shows the carbon concentration of AlGaNs grown on the GaN substrate. In FIG. 5, for example, at a growth pressure of 50 torr, the carbon concentration of AlGaN on the Sap substrate is $3.2 \times 10^{18}$ cm$^{-3}$, the leakage current is $2.2 \times 10^{-9}$ A/mm, and the current collapse is 10.41. The term "Sap substrate" stands for sapphire substrate.

As shown in FIGS. 4 and 5, the trade-off relationship between the leakage current and the current collapse holds regardless of the type of the substrate. In FIG. 5, at a growth pressure of 150 torr, the carbon concentration is, for example, $9.7 \times 10^{16}$ cm$^{-3}$, which is less than $1.0 \times 10^{17}$ cm$^{-3}$. Within such a range of the carbon concentration, the HEMT structure on the GaN substrate with low dislocation density has excellent characteristics of both the leakage current and the current collapse.

Although the trade-off relationship between leakage current and current collapse holds regardless of the type of the substrate, the leakage current of the epitaxial substrate prepared with the sapphire substrate and the SiC substrate used in the experiment is greater than that of the epitaxial substrate prepared with the GaN substrate, and the current collapse also increases as the carbon concentration increases. The leakage current of the epitaxial substrate prepared with the GaN substrate in the experiment is small. Even when the carbon concentration is reduced to suppress current collapse, the increase in leakage current is within an acceptable range. In other words, this reveals that an epitaxial substrate using a GaN substrate with low dislocation density can partially improve the trade-off relationship.

In order to prepare epitaxial substrates with various dislocation densities, sapphire, SiC and GaN substrates were used in the experiments. The improvement of the trade-off relationship does not essentially depend on the type of the substrate but depends on the dislocation density in a buffer layer. A GaN substrate with low dislocation density is suitable for growing a buffer layer with low dislocation density. This buffer layer is used as an underlying layer of low dislocation density for growing the AlGaN barrier layer thereon. Thus, an AlN substrate or an AlN/sapphire template that have a low dislocation density can also weaken the trade-off relationship (the trade-off relationship between leakage current and current collapse) if its dislocation density is $1 \times 10^8$ cm$^{-2}$ or less.

In other words, in the HEMT structure on the GaN substrate with low dislocation density, the leakage current slightly increases as the carbon concentration is reduced by use of an increased growth pressure. Such an increase in the leakage current is sufficiently small, which is acceptable, and the growth recipes can reduce the current collapse to a practical level. The practical level of current collapse is marked by "Ref1" in FIG. 4. The level "Ref1" is, for example, approximately 1.3 in terms of on-resistance ratio.

Figure 6:
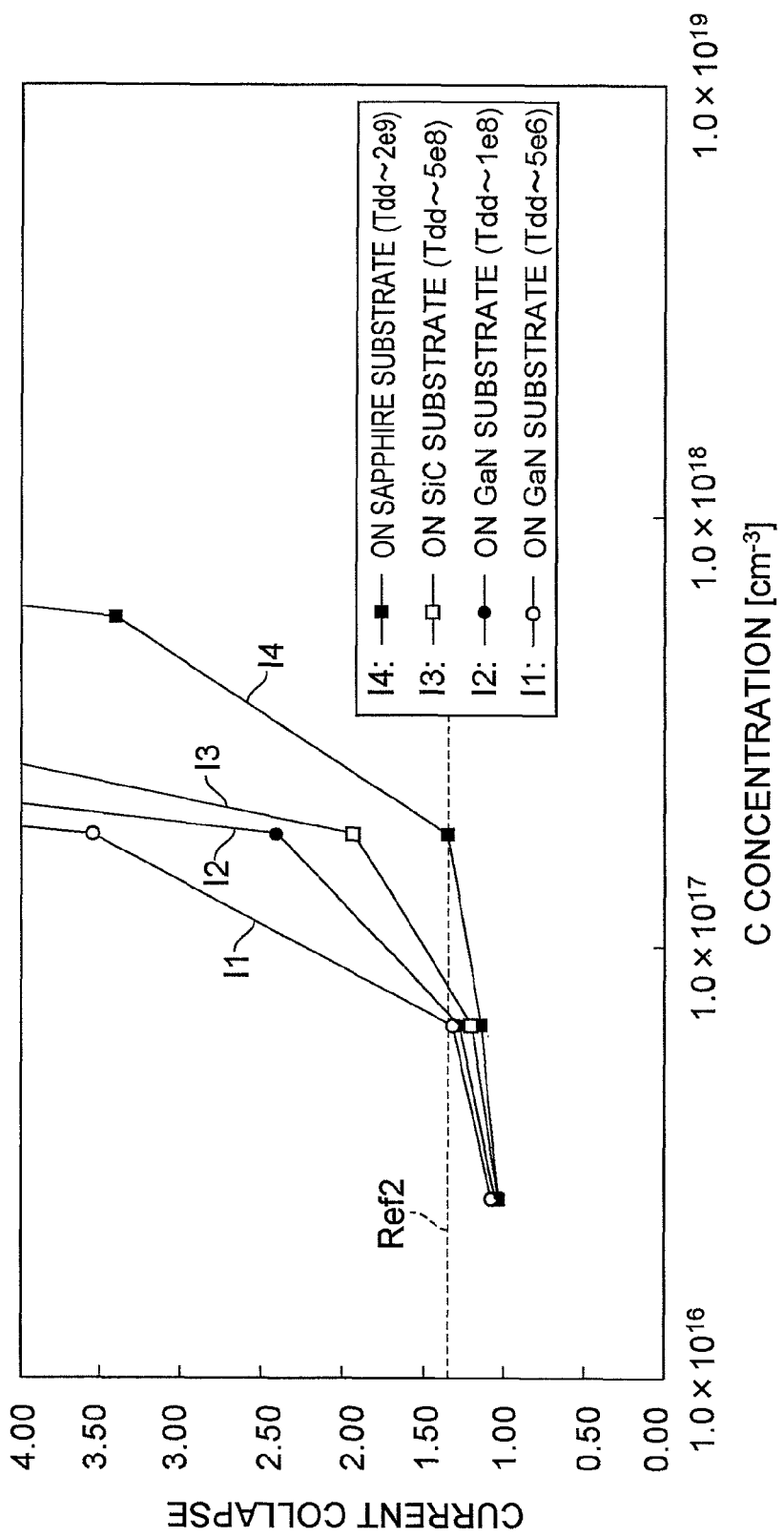
FIG. 6 is a graph indicating the relationship between carbon concentration and current collapse.

FIG. 6 is a graph showing the relationship between the carbon concentration and the current collapse. FIG. 6 shows characteristic curves I1 to I4. A device exhibiting large current collapse has a large increase in the on-resistance. Accordingly, it is preferred that the current collapse be approximately 1.3 or less. The value of "Ref2" in FIG. 6 indicates 1.3. In FIG. 5, in the carbon concentration of less than $1 \times 10^{17}$ cm$^{-3}$, the dislocation density range from $2 \times 10^9$ cm$^{-3}$ to $5 \times 10^6$ cm$^{-3}$ permits a practical level of current collapse.

Figure 7:
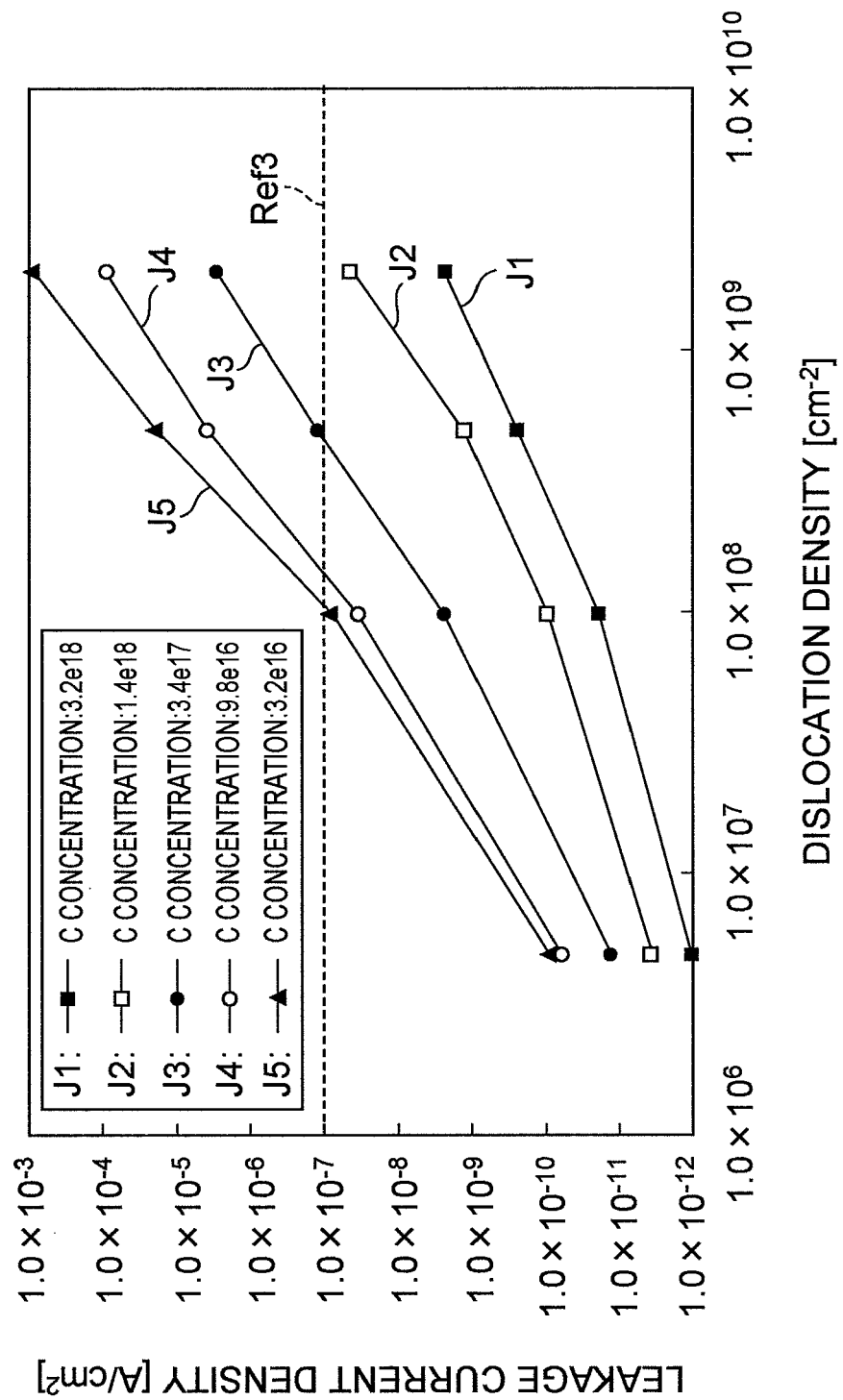
FIG. 7 is a graph indicating the relationship between dislocation density and leakage current density.

FIG. 7 is a graph indicating the relationship between the dislocation density and the leakage current density. FIG. 7 shows characteristic curves, J1 to J5. A practical level of leakage current is $1 \times 10^{-7}$ A/cm$^{-2}$ or less. In FIG. 7, this value is referred to as "Ref3." The leakage current decreases as the carbon concentration decreases. But, taking the value of the current collapse into consideration, the carbon concentration is preferably less than $1 \times 10^{17}$ cm$^{-3}$. When the carbon concentration is less than $1 \times 10^{17}$ cm$^{-3}$ and the dislocation density is less than $1 \times 10^8$ cm$^{-2}$, the leakage current and the current collapse both fall in the practical ranges.

In the experiments above, the growth pressure was varied to modify the carbon concentration. However, the carbon concentration can be reduced by modifying other parameters, such as growth temperature, flow rate of ammonia, V/III molar ratio, and deposition rate. According to experiments conducted by the inventors, varying these parameters produced similar results. An increase in the growth temperature reduces the carbon concentration. An increase in the flow rate of ammonia reduces the carbon concentration. An increase in the V/III ratio reduces the carbon concentration. A decrease in the growth rate reduces the carbon concentration.

In the above experiments, a reduction in the carbon concentration in the barrier layer was described. In addition to the reduction in the carbon concentration, doping the barrier layer with silicon (Si) also resulted in effects similar to that in the reduction in the carbon concentration.

Epitaxial substrates were fabricated with various silicon concentrations. The fabrication conditions used were the same as those for the epitaxial substrates A-3, B-3, C-3, and D-3 (under a growth pressure of 100 torr for AlGaNs), and AlGaN layers for the present epitaxial substrates were doped with silicon at $3.1 \times 10^{16}$ cm$^{-3}$, $1.1 \times 10^{17}$ cm$^{-3}$, or $3.7 \times 10^{17}$ cm$^{-3}$. The index of current collapse and the leakage current were evaluated in these epitaxial substrates.

Figure 8:
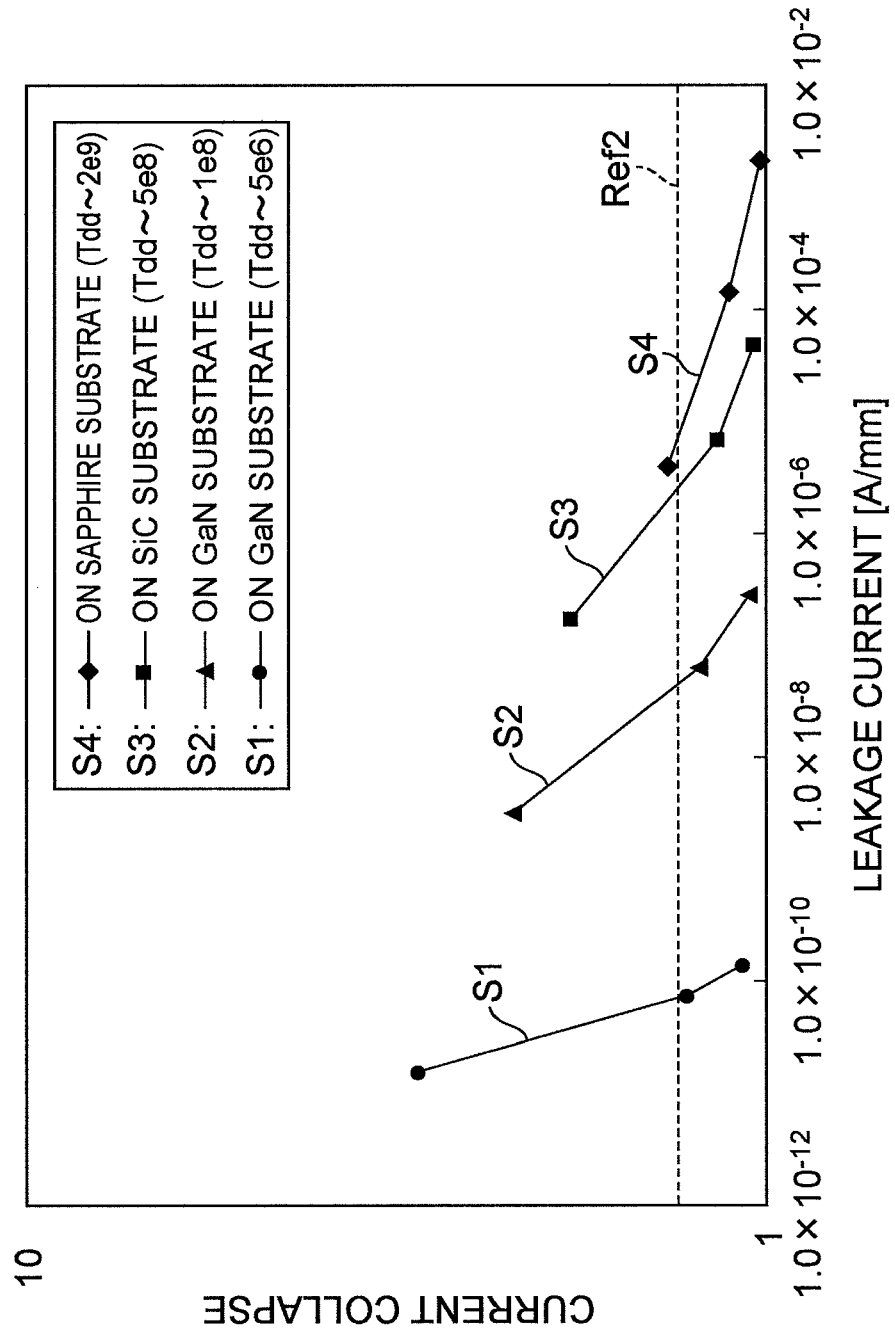
FIG. 8 is a graph indicating the relationship between leakage current density and current collapse with respect to the incorporation of silicon.

FIG. 8 shows the experimental results. FIG. 8 indicates characteristic curves, S1, S2, S3, and S4. FIG. 9 summarizes the results shown in FIG. 8. FIG. 9 shows a table of the silicon concentrations of AlGaNs over the GaN substrates. In FIG. 9, for example, at a growth pressure of 100 torr, the carbon concentration in AlGaN over the Sap substrate is $3.4 \times 10^{17}$ cm$^{-3}$, the silicon concentration is $3.1 \times 10^{16}$ cm$^{-3}$, the leakage current is $3.9 \times 10^{-6}$ A/mm; and the index of current collapse is 1.36. The carbon concentration was set to $3.4 \times 10^{17}$ cm$^{-3}$ regardless of the silicon concentration.

As shown in FIG. 8, the trade-off relationship between the leakage current and the current collapse holds regardless of the type of the substrate. In FIG. 9, at a growth pressure of 100 torr, the silicon concentration is, for example, $1.1 \times 10^{17}$ cm$^{-3}$, which is not smaller than $1.0 \times 10^{17}$ cm$^{-3}$. Within such a range of the silicon concentration, satisfactory characteristics are obtained for both the leakage current and the current collapse in the HEMT structure on the GaN substrate with low dislocation density.

From another perspective, a silicon concentration equal to or higher than the carbon concentration can provide satisfactory characteristics of both the leakage current and the current collapse in the HEMT structure on the GaN substrate with low dislocation density. In AlGaN with high dislocation density (such as in AlGaN grown over the sapphire substrate or the SiC substrate), doping AlGaN with silicon significantly increases the leakage current but decreases the current collapse. Meanwhile, in AlGaN with low dislocation density (such as in AlGaN grown on the GaN substrate with low dislocation density), the increase in the leakage current by addition of Si is sufficiently low while the current collapse can be significantly reduced. When the addition of both carbon and silicon is used, their suitable concentration ranges are as follows. The carbon concentration is preferably $3 \times 10^{16}$ cm$^{-3}$ or higher because it is difficult to reduce carbon to a concentration lower than the above value. The carbon concentration is preferably $1 \times 10^{19}$ cm$^{-3}$ or less because otherwise a satisfactory epitaxial film cannot be obtained. The silicon concentration is preferably $3 \times 10^{16}$ cm$^{-3}$ or higher because it is difficult to reduce the carbon concentration to $3 \times 10^{16}$ cm$^{-3}$ or less. The silicon concentration is preferably $1 \times 10^{19}$ cm$^{-3}$ or less because the leakage current increases if the silicon concentration is too high.

A reduction in the carbon concentration in the buffer layer (for example, the GaN buffer layer) can produce the same effects as those according to this embodiment. Specifically, it is effective in reducing the current collapse. In the above examples, although the HEMT structure is described, the present invention is not limited to the embodiments described in the embodiments. It also achieves equivalent effects in lateral electronic devices such as a lateral Schottky barrier diode.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

INDUSTRIAL APPLICABILITY

In the conventional art, recipes used in fabrication of an epitaxial film for a HEMT structure on a GaN substrate were the same as those in fabrication of an epitaxial film for a HEMT structure on a sapphire substrate. The growth recipes that provide a carbon concentration of $3 \times 10^{17}$ cm$^{-3}$ or higher has been applied to epitaxial growth onto the GaN substrate without modification, so that, as compared with the HEMT structure on the sapphire substrate, the current collapse was high, but the leakage current was extremely low.

However, as described above, reducing the carbon concentration to less than $1 \times 10^7$ cm$^{-3}$ in AlGaN can simultaneously improve the current collapse and the leakage current. Increasing the silicon concentration to $1 \times 10^{17}$ cm$^{-3}$ or higher in AlGaN can also simultaneously improve the current collapse and the leakage current. Furthermore, using a silicon concentration greater than the carbon concentration in AlGaN can simultaneously improve the current collapse and the leakage current. In other words, an underlying semiconductor region with low dislocation density makes it possible to use deposition recipes that increase the leakage current. This partially breaks through the trade-off relationship between the leakage current and the current collapse, and can mostly suppress the current collapse while achieving low leakage current.

The invention claimed is:

1. A group III nitride electronic device, comprising:
   a first $Al_{X1}In_{X2}Ga_{1-X1-X2}N$ ($0<X1<1$, $0 \leq X2<1$, $0<X1+X2<1$) layer;
   a second $Al_{Y1}In_{Y2}Ga_{1-Y1-Y2}N$ ($0 \leq Y1<1$, $0 \leq Y2<1$, $0 \leq Y1+Y2<1$) layer forming a hetero-junction with the first $Al_{X1}In_{X2}Ga_{1-X1-X2}N$ layer;
   a first electrode provided on the first $Al_{X1}In_{X2}Ga_{1-X1-X2}N$ layer; and
   a second electrode provided on the first $Al_{X1}In_{X2}Ga_{1-X1-X2}N$ layer,
   the first $Al_{X1}In_{X2}Ga_{1-X1-X2}N$ layer being provided on the second $Al_{Y1}In_{Y2}Ga_{1-Y1-Y2}N$ layer,
   a band gap of the first $Al_{X1}In_{X2}Ga_{1-X1-X2}N$ layer being greater than that of the second $Al_{Y1}In_{Y2}Ga_{1-Y1-Y2}N$ layer,
   a carbon concentration in the first $Al_{X1}In_{X2}Ga_{1-X1-X2}N$ layer being in a range of $3 \times 10^{16}$ cm$^{-3}$ or higher and less than $1 \times 10^{17}$ cm$^{-3}$,
   a dislocation density of the second $Al_{Y1}In_{Y2}Ga_{1-Y1-Y2}N$ layer being less than $1 \times 10^8$ cm$^{-2}$, and
   the first electrode forming a Schottky junction with the first $Al_{X1}In_{X2}Ga_{1-X1-X2}N$ layer.

2. The group III nitride electronic device according to claim 1, wherein
   the first $Al_{X1}In_{X2}Ga_{1-X1-X2}N$ layer includes an AlGaN barrier layer;
   the group III nitride electronic device includes a hetero junction transistor;
   the first electrode includes a gate electrode of the hetero junction transistor;
   the second electrode includes a drain electrode of the transistor; and
   the group III nitride electronic device further comprises a source electrode provided on the first $Al_{X1}In_{X2}Ga_{1-X1-X2}N$ layer.

3. The group III nitride electronic device according to claim 2, wherein the second $Al_{Y1}In_{Y2}Ga_{1-Y1-Y2}N$ layer comprises GaN.

4. The group III nitride electronic device according to claim 1, wherein
   the first $Al_{X1}In_{X2}Ga_{1-X1-X2}N$ layer includes an AlGaN layer;
   the group III nitride electronic device includes a Schottky barrier diode;
   the first electrode includes an anode for the Schottky barrier diode; and
   the second electrode includes a cathode for the Schottky barrier diode.

5. The group III nitride electronic device according to claim 1, further comprising a GaN substrate, the GaN substrate having a dislocation density of $1 \times 10^8$ cm$^{-2}$ or less; and the second $Al_{Y1}In_{Y2}Ga_{1-Y1-Y2}N$ layer being provided on the GaN substrate.

6. The group III nitride electronic device according to claim 5, wherein the GaN substrate is semi-insulating.

7. The group III nitride electronic device according to claim 1, further comprising a GaN template, the GaN template having a dislocation density of $1 \times 10^8$ cm$^{-2}$ or less, and the second $Al_{Y1}In_{Y2}Ga_{1-Y1-Y2}N$ layer being provided over the GaN template.

8. A group III nitride semiconductor epitaxial substrate for a group III nitride electronic device having a Schottky electrode, the group III nitride semiconductor epitaxial substrate comprising:
- a substrate;
- a first $Al_{X1}In_{X2}Ga_{1-X1-X2}N$ ($0<X1<1$, $0\leq X2<1$, $0<X1+X2<1$) layer provided on the substrate; and
- a second $Al_{Y1}In_{Y2}Ga_{1-Y1-Y2}N$ ($0\leq Y1<1$, $0\leq Y2<1$, $0\leq Y1+Y2<1$) layer provided on the substrate, the second $Al_{Y1}In_{Y2}Ga_{1-Y1-Y2}N$ layer forming a hetero junction with the first $Al_{X1}In_{X2}Ga_{1-X1-X2}N$ layer,
- the second $Al_{Y1}In_{Y2}Ga_{1-Y1-Y2}N$ layer being provided between the first $Al_{X1}In_{X2}Ga_{1-X1-X2}N$ layer and the substrate,
- a band gap of the first $Al_{X1}In_{X2}Ga_{1-X1-X2}N$ layer being greater than that of the second $Al_{Y1}In_{Y2}Ga_{1-Y1-Y2}N$ layer,
- a carbon concentration in the first $Al_{X1}In_{X2}Ga_{1-X1-X2}N$ layer being in a range of $3\times10^{16}$ cm$^{-3}$ or higher and less than $1\times10^{17}$ cm$^{-3}$, and
- a dislocation density of the second $Al_{Y1}In_{Y2}Ga_{1-Y1-Y2}N$ layer being less than $1\times10^8$ cm$^{-2}$.

9. The group III nitride semiconductor epitaxial substrate according to claim 8, wherein
the first $Al_{X1}In_{X2}Ga_{1-X1-X2}N$ layer includes a AlGaN barrier layer, and
the group III nitride electronic device includes a hetero junction transistor and the Schottky electrode includes a gate electrode in the hetero junction transistor.

10. The group III nitride semiconductor epitaxial substrate according to claim 8, wherein
the first $Al_{X1}In_{X2}Ga_{1-X1-X2}N$ layer includes an AlGaN layer, and
the group III nitride electronic device includes a lateral Schottky barrier diode and the Schottky electrode includes an anode in the lateral Schottky barrier diode.

11. The group III nitride semiconductor epitaxial substrate according to claim 9, wherein the second $Al_{Y1}In_{Y2}Ga_{1-Y1-Y2}N$ layer comprises GaN.

12. The group III nitride semiconductor epitaxial substrate according to claim 8, wherein the substrate comprises a GaN substrate having a dislocation density of $1\times10^8$ cm$^{-2}$ or less.

13. The group III nitride semiconductor epitaxial substrate according to claim 12, wherein the GaN substrate is made of semi-insulating GaN.

14. The group III nitride semiconductor epitaxial substrate according to claim 8, wherein the substrate comprises a GaN template having a dislocation density of $1\times10^8$ cm$^{-2}$ or less.

* * * * *

UNITED STATES PATENT AND TRADEMARK OFFICE
CERTIFICATE OF CORRECTION

| | |
|---|---|
| PATENT NO. | : 8,541,816 B2 |
| APPLICATION NO. | : 12/740770 |
| DATED | : September 24, 2013 |
| INVENTOR(S) | : Hashimoto et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 411 days.

Signed and Sealed this
Twenty-fourth Day of February, 2015

Michelle K. Lee
*Deputy Director of the United States Patent and Trademark Office*